United States Patent
Kato et al.

(10) Patent No.: US 10,067,190 B2
(45) Date of Patent: Sep. 4, 2018

(54) INSULATION DIAGNOSTIC SYSTEM OR ROTATING MACHINE

(71) Applicant: Hitachi, Ltd., Tokyo (JP)

(72) Inventors: Tetsuji Kato, Tokyo (JP); Kohji Maki, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 15/501,250

(22) PCT Filed: Sep. 8, 2014

(86) PCT No.: PCT/JP2014/073607
§ 371 (c)(1),
(2) Date: Feb. 2, 2017

(87) PCT Pub. No.: WO2016/038651
PCT Pub. Date: Mar. 17, 2016

(65) Prior Publication Data
US 2017/0219655 A1    Aug. 3, 2017

(51) Int. Cl.
*G01R 31/02* (2006.01)
*G01R 31/34* (2006.01)
*H02K 11/27* (2016.01)

(52) U.S. Cl.
CPC ............. *G01R 31/34* (2013.01); *H02K 11/27* (2016.01)

(58) Field of Classification Search
CPC ........ G01R 31/02; G01R 31/08; G01R 31/12; G01R 31/34; G01R 35/00; H02H 3/00; H02H 9/08; H02P 1/00; H02P 3/00; H02P 6/00; H02P 23/00

USPC .............. 324/541, 544, 551, 557; 361/812; 318/400.01, 700, 701, 727, 800, 801
See application file for complete search history.

(56) References Cited

U.S. PATENT DOCUMENTS

| | | | |
|---|---|---|---|
| 9,772,364 B2 * | 9/2017 | Lu ........................ | G01R 31/024 |
| 2005/0218906 A1 * | 10/2005 | Younsi ................ | G01R 31/346 |
| | | | 324/551 |
| 2005/0280422 A1 | 12/2005 | Kishibata et al. | |
| 2009/0096405 A1 | 4/2009 | Flickinger et al. | |
| 2015/0123676 A1 * | 5/2015 | Lu ........................ | G01R 31/024 |
| | | | 324/551 |

FOREIGN PATENT DOCUMENTS

| | | | |
|---|---|---|---|
| JP | 2004-064896 A | | 2/2004 |
| JP | 2006-006043 A | | 1/2006 |
| JP | 2009-099144 A | | 5/2009 |

(Continued)

OTHER PUBLICATIONS

International Search Report of PCT/JP2014/073607 dated Dec. 9, 2014.

*Primary Examiner* — Antony M Paul
(74) *Attorney, Agent, or Firm* — Mattingly & Malur, PC (57) ABSTRACT

An object is to conduct an insulation degradation diagnosis with a simple configuration. An insulation diagnostic system includes a current detection sensor 4a that is installed, for a coil 3a of at least one phase of a Δ connection type rotating machine in which current flows in the reverse direction at a winding start position and a winding end position, such that the current detection sensor 4a surrounds a current path flowing into a leader line at the winding start of the coil 3a and a current path flowing out from a leader line at the winding end of the coil 3a.

21 Claims, 6 Drawing Sheets

(56) References Cited

FOREIGN PATENT DOCUMENTS

| | | | |
|---|---|---|---|
| JP | 2009-278849 | A | 11/2009 |
| JP | 2011-058826 | A | 3/2011 |
| JP | 2013-093971 | A | 5/2013 |

* cited by examiner

INSULATION DIAGNOSTIC SYSTEM OR ROTATING MACHINE

TECHNICAL FIELD

The present invention relates to an insulation diagnostic system or a rotating machine.

BACKGROUND ART

When a rotary machine such as a motor or a generator suddenly breaks down, unplanned repair work or replacement of the rotating machine is needed, and a drop in operating ratio of the production equipment or a reconsideration of the production plan is necessary. Although it is possible to understand the extent of degradation and prevent a sudden breakdown by appropriately stopping the motor and diagnosing offline, this will result in a drop in the operation ratio of the production equipment as the rotating machine has to be stopped for an offline diagnosis. Thus, there is a growing need for on-line diagnosis which makes diagnosis possible during operation of the rotating machine. An inverter surge occurring when the rotating machine is driven at variable speeds by the inverter is one of the main causes of sudden breakdowns. Problems such as an acceleration of insulation degradation of the rotating machine resulted from the inverter surge, and an acceleration of bearing deterioration due to electrochemical corrosion of the bearing have occurred. This trend is expected to become more prominent with the advent of semiconductor devices using new materials such as SiC (silicon carbide).

Here, as a related art, for example, there is one disclosed in Patent Literature 1. In Patent Literature 1, degradation can be detected by using an optical fiber current sensor to constantly monitor the current flowing through the winding wires inside a rotating machine during operation. As a method of measuring the leakage current from the difference between the values of current flowing through the coils at two positions spatially separated from each other, it discloses a method of obtaining by signal processing and the like using two optical fiber current sensors, and a method of winding the optical fiber current sensors at the two coil positions in opposite directions from each other and with the same number of times of windings.

CITATION LIST

Patent Literature

PTL 1: JP-A-2013-93971

SUMMARY OF INVENTION

Technical Problem

However, in the aforementioned related art, the optical fiber current sensors are wound at the two coil positions in opposite directions from each other and with the same number of times of windings. An optical fiber cable is required to be used as a special current detection sensor capable of being wound around, and it has been difficult to use a general-purpose current detection sensor.

An object of the invention is to conduct an insulation degradation diagnosis with a simple configuration.

Solution to Problem

In order to solve the above problem, an insulation diagnostic system according to the invention includes a current detection sensor that is installed, for a coil of at least one phase of a Δ connection type rotating machine in which current flows in the reverse direction at a winding start position and a winding end position, such that the current detection sensor surrounds a current path flowing into a leader line at the winding start of the coil and a current path flowing out from a leader line at the winding end of the coil.

A rotating machine according to the invention includes a stator, a rotor which faces the stator via a gap and which rotates, the insulation diagnostic system, and the coil, wherein the coil is provided in the rotator or the stator.

Advantageous Effects of Invention

According to the invention, the insulation degradation diagnosis can be conducted with a simple configuration.

DESCRIPTION OF EMBODIMENTS

Embodiments of the invention will be described below with reference to the drawings. Although a motor is used in the following description, in the case of a generator, it can be implemented in the same form except that only the direction of flow of electric power is reversed. The following are merely examples, and the embodiments of the invention are not intended to be limited to the following embodiments.

First Embodiment

Figure 1:
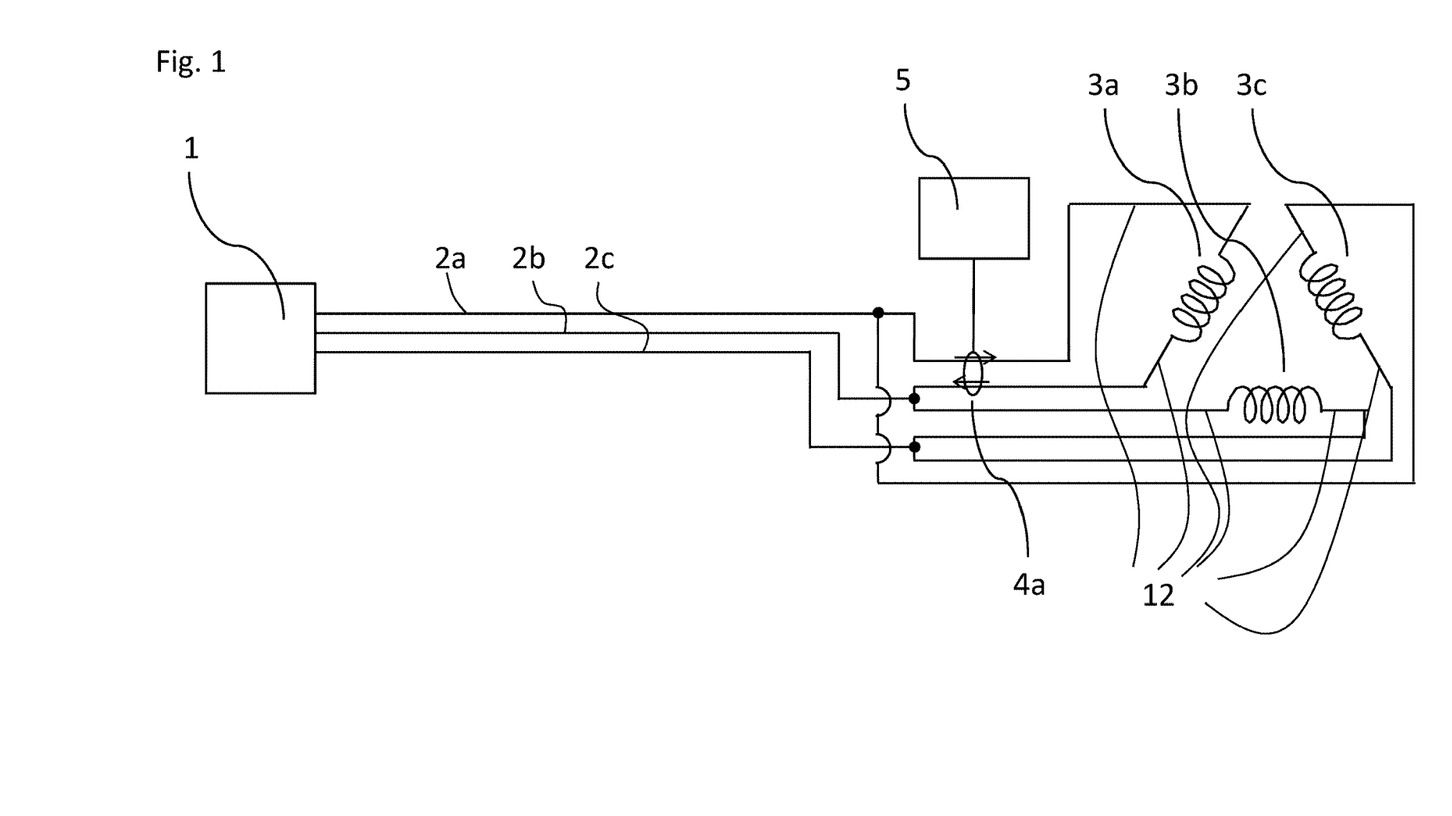
FIG. 1 is a schematic diagram of an insulation degradation diagnostic system according to a first embodiment of the invention.

Electric power is supplied from a power supply 1 via feeders 2a, 2b, and 2c to coils 3a, 3b, and 3c of each phase of a Δ connection type motor. Although a three-phase motor using three feeders is shown herein, a different number of phases may also be used. A leader line 12 is attached to both ends of a coil, and the winding end of the coil is connected to the winding start of another phase. The leader line 12 herein is used to electrically connect the winding end of a coil to the winding start of a coil of another phase. Any material may be used as long as it is a conductive material, and it may be formed of the same material as the coil, or may be a part of the coil. In addition, for the winding start and the winding end of the coil in one coil, when one end is determined as the winding start, the other end is uniquely determined as the winding end. For the winding start and the winding end among different phases, they cannot be determined uniquely. It can be interpreted that the winding start of a coil is connected to the winding end of another phase, and it can also be interpreted that the winding start of the coil is connected to the winding start of another phase. However, they are substantially the same, and it is unnecessary to distinguish between the two.

As indicated by the arrow in FIG. 1, a current detection sensor 4a is disposed to surround the leader line 12 which is arranged so that the current flows in the reverse direction of the winding start and the winding end of the coil. The type of the current detection sensor is not particularly limited. By getting close to the leader line 12 spatially, it is possible to use a general-purpose current detection sensor such as a through-type current detection sensor, a clamp type current detection sensor, and a split type current detection sensor. These sensors may be used independently, or in a combination of any of these sensors.

In the present embodiment, the current detection sensor 4a is disposed to surround the leader line 12 which is arranged so that the current flows in the reverse direction of the winding start and the winding end of the coil. However, any current detection sensor will do as long as it surrounds the current path flowing into a leader line at the winding start or a current path flowing out from a leader line at the winding end. The leader line at the winding start itself is also included in the current path flowing into the leader line at the winding start, and the leader line at the winding end itself is also included in the current path flowing out from the leader line at the winding end.

The spatial position at which the winding start and the winding end of the coil are connected is not particularly limited, as long as the winding start of a coil of a phase is electrically connected to the winding end of another phase. The connection position may be selected inside or outside the motor as needed. For example, in a method, a first terminal is connected to the end of the leader line at the winding end of a coil, a second terminal is connected to the leader line at the winding start of a coil of another phase in the same manner, and the first terminal and the second terminal are electrically connected in a third terminal. Any of these terminals may be disposed on the surface of the rotating machine. In this way, it is easy to attach and detach the current detection sensor and the wiring of the power supply.

When connecting inside the motor, the advantage is that the length of the leader line of the motor can be shortened as compared with the case where the leader line 12 is put out of the motor. On the other hand, when connecting outside the motor, the advantage is that the current detection sensor can be easily attached and detached, and it is unnecessary to prepare a current detection sensor for each rotating machine. For connection outside the motor, will be particularly described in a following embodiment.

The measured data from the current detection sensor is collected by a current analyzer 5, converted into information relating to insulation degradation signs, and is transmitted to the user. The current analyzer 5 preferably has a function capable of frequency-converting the signals of the current detection sensor 4a, and in that case it also has the function as a frequency converting apparatus.

In the insulation diagnostic system of the present embodiment, degradation detection is conducted by checking how the leakage current value changes with time. In this embodiment, upon degradation detection, degradation detection is conducted by disposing the current detection sensor 4a to surround the leader line which is arranged so that the current flows in the reverse direction of the winding start and the winding end of the coil, and detecting the change of the leakage current value with time using the current detection sensor 4a. In this way, it is possible to conduct degradation detection in a simple manner. Moreover, when the voltage characteristics of the power supply 1 are known (furthermore, it is preferable that the voltage characteristics do not change greatly depending on measurement conditions such as temperature and time), insulation degradation signs can be detected by calculating the real part and the imaginary part of the impedance of an insulating member from the leakage current value measured by the current detection sensor 4a and the voltage characteristics of the power supply 1, and deriving the electric capacity and the insulation resistance (including contribution of dielectric loss) of the insulating member. In this way, it is possible to omit units for voltage detection. It is also an advantage of the invention that what kind of sensor is required is corresponding to each installation environment, and it is possible to detect degradation signs at the minimum necessity.

As mentioned above, according to the insulation diagnostic system and the rotating machine of the invention, it is possible to detect insulation degradation in an operating state by, for a $\Delta$ connection type motor, disposing the current detection sensor 4a to surround the winding start and the winding end of a coil which is arranged so that the current flows in the reverse direction of the winding start and the winding end of the coil of a phase, even using a general-purpose current detection sensor.

Second Embodiment

Figure 2:
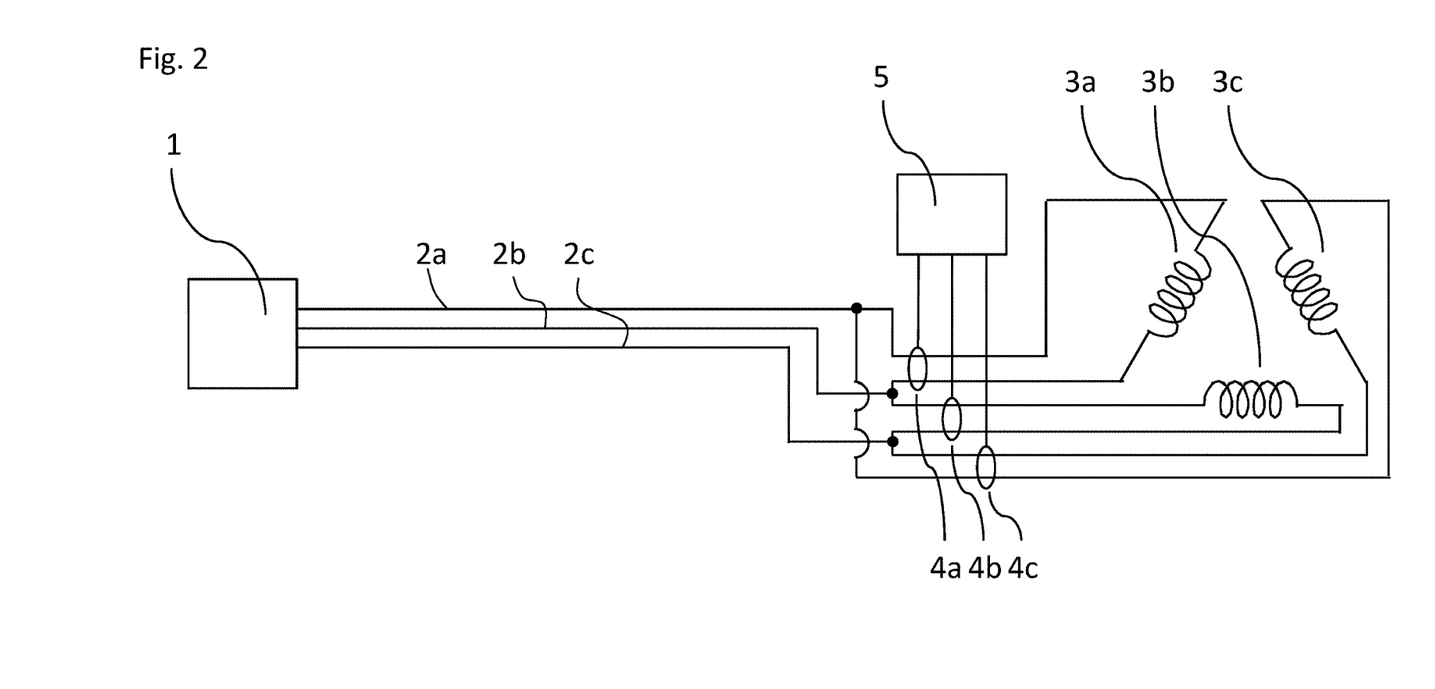
FIG. 2 is a schematic diagram of an insulation degradation diagnostic system according to a second embodiment of the invention.

FIG. 2 is a configuration diagram showing the second embodiment of the insulation diagnostic system and the rotating machine of the invention. The difference from the first embodiment is that, in a plurality of phases, current detection sensors 4a, 4b, and 4c are disposed respectively to surround the winding start and the winding end which are arranged so that the current flows in the reverse direction of the winding start and the winding end. With such a configuration, it is possible to detect, out of the plurality of phases, in which phase the degradation is worsening. Information obtained from each sensor is processed separately. In FIG. 2, it is described based on the configuration in which current detection sensors 4a, 4b, and 4c are provided for each phase of all the three phases. However, for example, when two current detection sensors are provided, it is possible to diagnose insulation of the two phases where the current detection sensors are disposed, and it is possible to detect in which phase between the two phases the degradation is worsening.

In addition, as information is processed at each sensor, comparing with the case obtaining from signal processing and the like using a plurality of sensors, it is unnecessary to worry about individual differences of the sensors, and an effect of improving the measurement accuracy can be expected.

Third Embodiment

Figure 3:
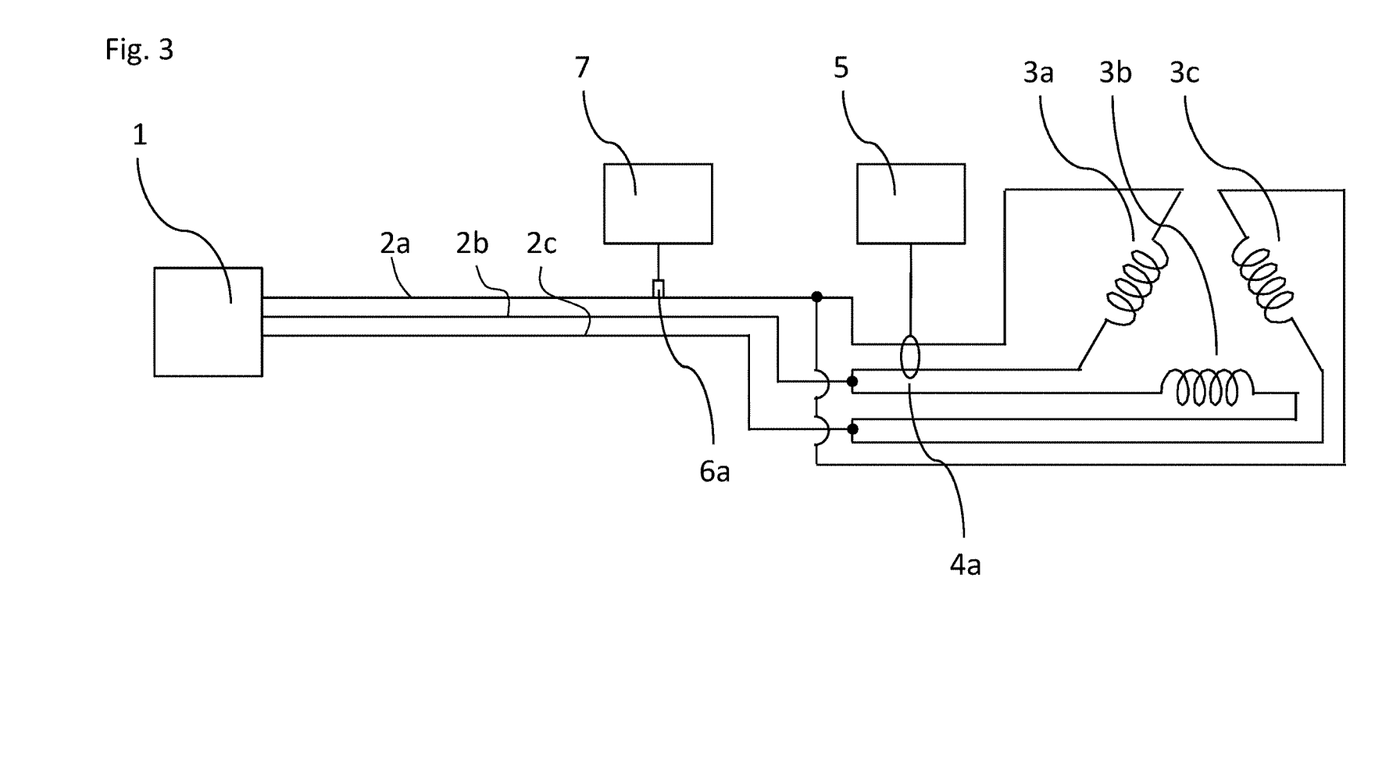
FIG. 3 is a schematic diagram of an insulation degradation diagnostic system according to a third embodiment of the invention.

FIG. 3 is a configuration diagram showing the third embodiment of the insulation diagnostic system and the rotating machine of the invention. The difference from the first embodiment is that a voltage detection sensor 6a is installed to the same phase where the current detection sensor 4a is installed.

The measured data from the voltage detection sensor 6a is collected by a voltage analyzer 7. The voltage analyzer 7 converts the signals measured by the voltage detection sensor 6a into frequency. The insulation degradation signs can be detected by calculating the real part and the imaginary part of the impedance of an insulating member from the data measured by the current analyzer 5 and the data measured by the voltage analyzer 6a, and deriving the electric capacity and the insulation resistance (including contribution of dielectric loss) of the insulating member.

The voltage detection sensor 6a and the feeder 2a here may be in contact, or may not be in contact with each other. Using a voltage probe is an example of bringing the voltage detection sensor 6a and the feeder 2a into contact, while using a surface electrometer is an example of not bringing the two into contact. Each can be selected according to resolving power required in diagnosis.

An example where the voltage characteristics of the power supply 1 are known (it is preferable that the voltage characteristics do not change greatly depending on measurement conditions such as temperature and time) was described in the first embodiment. However, in the cases where the supplied voltage varies, or where the output wave form changes due to degradation of the inverter, or where the voltage characteristics change depending on the measurement conditions, leading to unknown voltage characteristics, highly accurate detections can be achieved by measuring the current and the voltage at the same time as in the present embodiment.

Fourth Embodiment

Figure 4:
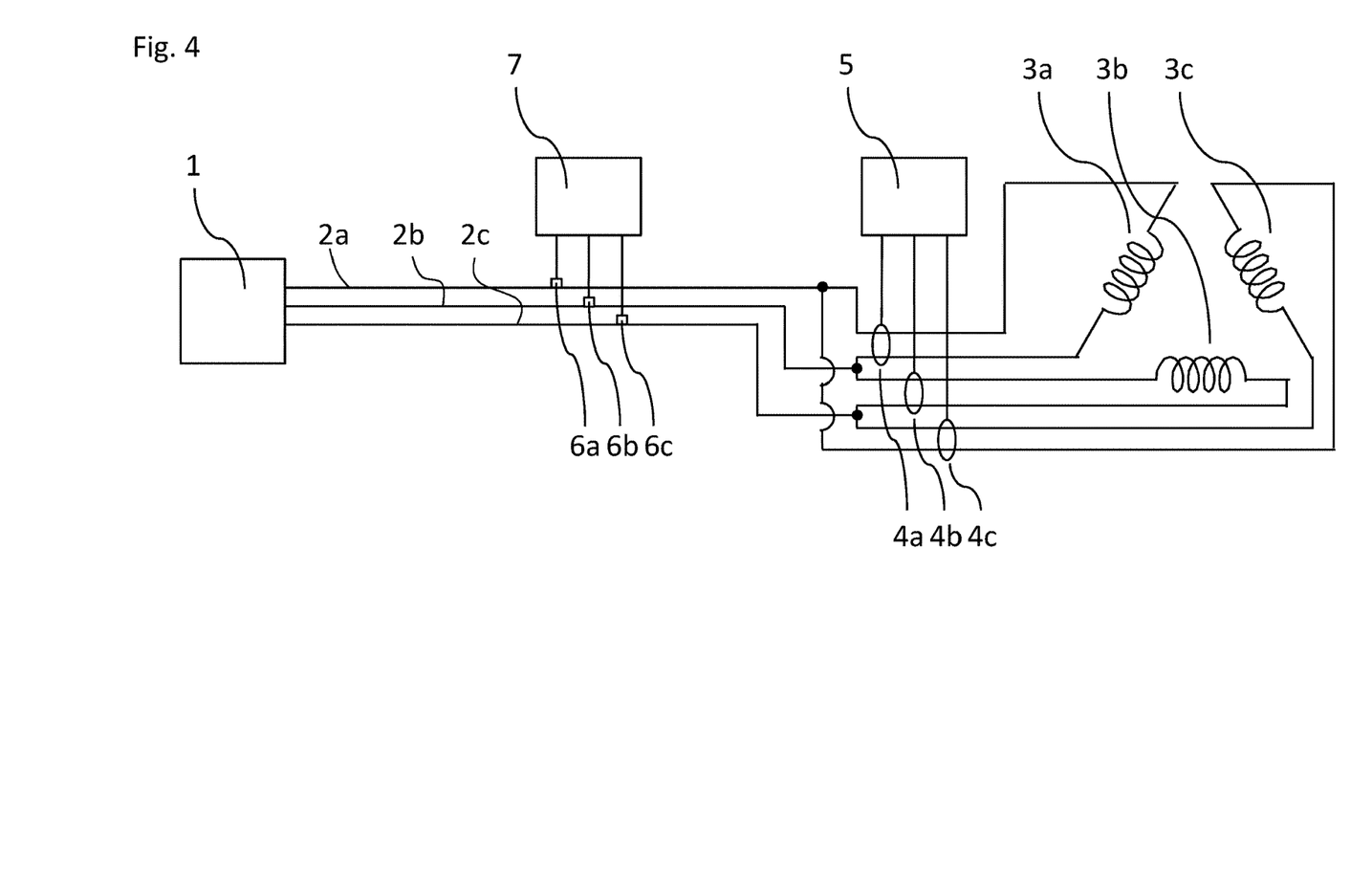
FIG. 4 is a schematic diagram of an insulation degradation diagnostic system according to a fourth embodiment of the invention.

FIG. 4 is a configuration diagram showing the fourth embodiment of the insulation diagnostic system and the rotating machine of the invention. The difference from the first embodiment is that, in a plurality of phases, current detection sensors 4a, 4b, and 4c are disposed respectively to surround the winding start and the winding end which are arranged so that the current flows in the reverse direction of the winding start and the winding end, and further, voltage detection sensors 6a, 6b, and 6c are installed to the same phases where current detection sensors 4a, 4b, and 4c are installed. With such a configuration, it is possible to detect insulation degradation signs of the coils of the plurality of phases to which the current detection sensors are connected.

Fifth Embodiment

Figure 5:
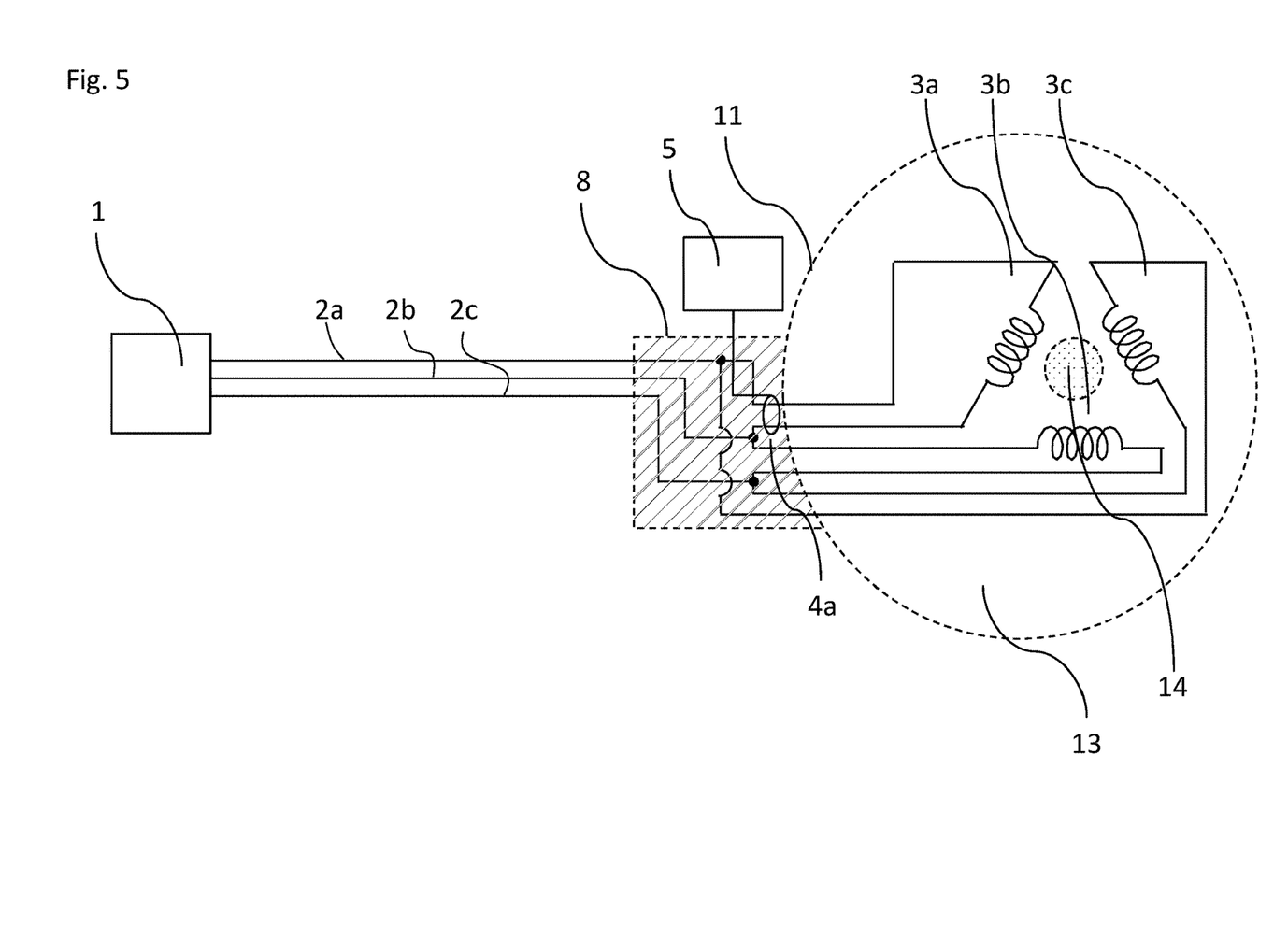
FIG. 5 is a schematic diagram of an insulation degradation diagnostic system according to a fifth embodiment of the invention.
Figure 6:
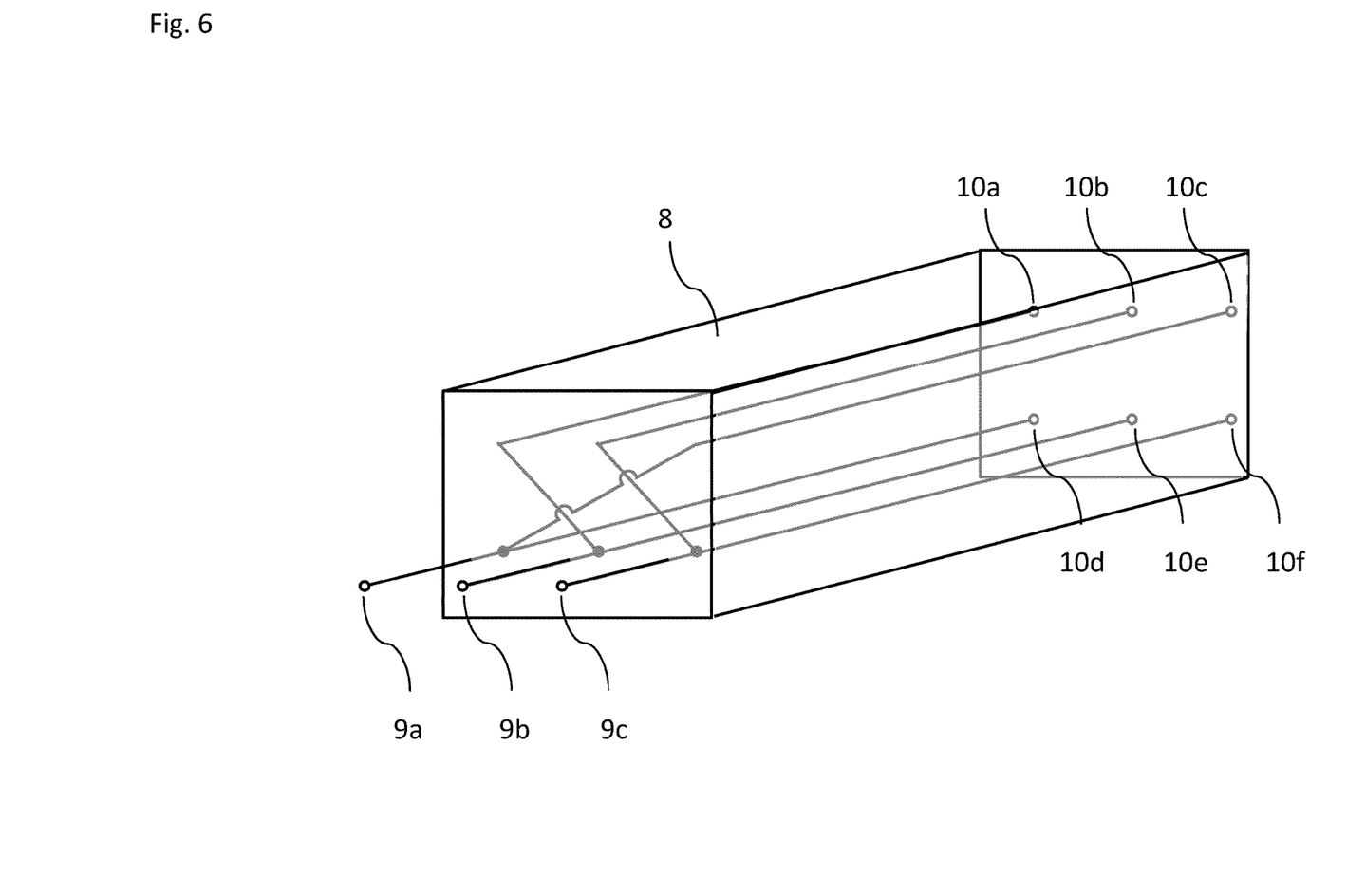
FIG. 6 is a schematic diagram of a rotating machine according to the fifth embodiment of the invention.

FIG. 5 is a configuration diagram showing the fifth embodiment of the insulation diagnostic system and the rotating machine of the invention. The present embodiment has a motor frame 11 for holding a stator 13 or a rotator 14 inside, and has a terminal block 8 installed to the motor frame 11. FIG. 6 shows the terminal block 8 installed to the periphery of the rotating machine. The terminal block 8 has motor side terminals 10a, 10b, 10c, 10d, 10e, and 10f and inverter side terminals 9a, 9b, and 9c for connecting the winding start and the winding end of the coils of each phase drawn from the interior of the motor. The aforementioned sensors are provided in this terminal block. That is, the sensors are provided outside the rotating machine, and thus it is easy to remove the sensors. Therefore, the sensors may be installed at all times, while they can also be installed when detection is needed. In the present embodiment, the sensors are disposed in the same way as in the circuit configuration diagram of the first embodiment. However, the arrangement of the sensors of any of the aforementioned embodiments can also be applied.

The motor side terminal 10a and the motor side terminal 10d are connected via a coil of a phase. Further, the motor side terminal 10b and the motor side terminal 10e are connected via a coil of another phase. Further, the motor side terminal 10c and the motor side terminal 10f are connected via a coil of another phase. That is, the connection relation is 10a-coil-10d-10c-coil-10f-10b-coil-10e-10a.

The inverter side terminals 9a, 9b, and 9c are electrically connected to the terminals of each phase of the inverter. In the present embodiment, the terminal block 8 is installed outside the rotating machine. Therefore, an easy diagnosis can be realized without disassembling the motor in every diagnosis by using the terminal block 8 of the rotating machine when measuring with an arrangement where, in a coil of at least one phase of a Δ connection type rotating machine in which current flows in the reverse direction at a winding start position and a winding end position, a current detection sensor is disposed to surround a leader line at the winding start of the coil and a leader line at the winding end of the coil.

REFERENCE SIGNS LIST

1 Power supply
2a, 2b, 2c Feeder
3a, 3b, 3c Coil
4a, 4b, 4c Current detection sensor
5 Current analyzer
6a, 6b, 6c Voltage detection sensor
7 Voltage analyzer
8 Terminal block
9a, 9b, 9c Inverter side terminal
10a, 10b, 10c, 10d, 10e, 10f Motor side terminal
11 Motor frame
12 Leader line
13 Stator
14 Rotor

The invention claimed is:

1. An insulation diagnostic system comprising:
   a current detection sensor, the current detection sensor being installed, for a first coil of at least one phase of a Δ connection type rotating machine in which current flows in the reverse direction at a winding start of the first coil and a winding end of the first coil, such that the current detection sensor surrounds a current path flowing into a leader line at the winding start of the first coil and a current path flowing out from a leader line at the winding end of the first coil,
   wherein the leader line at the winding end of the first coil and a leader line at a winding start of a second coil of a phase different from that of the first coil of the rotating machine are electrically connected outside the rotating machine.

2. The insulation diagnostic system according to claim 1, further comprising:
   a first terminal which is connected to the leader line at the winding end of the first coil,
   a second terminal which is connected to the leader line at the winding start of the second coil, and
   a third terminal which electrically connects the first terminal and the second terminal.

3. The insulation diagnostic system according to claim 2, wherein each one of the terminals is provided on a surface of the rotating machine.

4. The insulation diagnostic system according to claim 1, wherein the current detection sensor is installed to each phase.

5. The insulation diagnostic system according to claim 1, further comprising:

a current analyzer connected to the current detection sensor and configured to frequency convert signals measured by the current detection sensor.

6. The insulation diagnostic system according to claim 1, further comprising:
a voltage detection sensor installed on at least one of the current path flowing into the leader line at the winding start of the first coil and the current path flowing out from the leader line at the winding end of the first coil.

7. The insulation diagnostic system according to claim 6, further comprising:
a voltage analyzer configured to frequency convert signals measured by the voltage detection sensor.

8. The insulation diagnostic system according to claim 1, wherein the current detection sensor is a through-type current detection sensor, a clamp type current detection sensor, a split type current detection sensor, or a combination of any of the through-type current detection sensor, the clamp type current detection sensor, and the split type current detection sensor.

9. The insulation diagnostic system according to claim 1, wherein the first coil and the second coil are provided in a rotator or a stator of the Δ connection type rotating machine.

10. An insulation diagnostic system, comprising:
a current detection sensor, the current detection sensor being installed, for a first coil of at least one phase of a Δ connection type rotating machine in which current flows in the reverse direction at a winding start of the first coil and a winding end of the first coil, such that the current detection sensor surrounds a current path flowing into a leader line at the winding start of the first coil and a current path flowing out from a leader line at the winding end of the first coil,
wherein the leader line at the winding end of the first coil and a leader line at a winding start of a second coil of a phase different from that of the first coil of the rotating machine are electrically connected inside the rotating machine.

11. The insulation diagnostic system according to claim 10, further comprising:
a first terminal which is connected to the leader line at the winding end of the first coil,
a second terminal which is connected to the leader line at the winding start of the second coil, and
a third terminal which electrically connects the first terminal and the second terminal.

12. The insulation diagnostic system according to claim 11, wherein each one of the terminals is provided on a surface of the rotating machine.

13. The insulation diagnostic system according to claim 10, wherein the current detection sensor is installed to each phase.

14. The insulation diagnostic system according to claim 10, further comprising:
a current analyzer connected to the current detection sensor and configured to frequency convert signals measured by the current detection sensor.

15. The insulation diagnostic system according to claim 10, further comprising:
a voltage detection sensor installed on at least one of the current path flowing into the leader line at the winding start of the first coil and the current path flowing out from the leader line at the winding end of the first coil.

16. The insulation diagnostic system according to claim 15, further comprising:
a voltage analyzer configured to frequency convert signals measured by the voltage detection sensor.

17. The insulation diagnostic system according to claim 10, wherein the current detection sensor is a through-type current detection sensor, a clamp type current detection sensor, a split type current detection sensor, or a combination of any of the through-type current detection sensor, the clamp type current detection sensor, and the split type current detection sensor.

18. The insulation diagnostic system according to claim 10,
wherein the first coil and the second coil are provided in a rotator or a stator of the Δ connection type rotating machine.

19. An insulation diagnostic system comprising:
a current detection sensor, the current detection sensor being installed, for a first coil of at least one phase of a Δ connection type rotating machine in which current flows in the reverse direction at a winding start position of the first coil and a winding end of the first coil, such that the current detection sensor surrounds a current path flowing into a leader line at the winding start of the first coil and a current path flowing out from a leader line at the winding end of the first coil; and
a current analyzer connected to the current detection sensor and configured to frequency convert signals measured by the current detection sensor.

20. An insulation diagnostic system comprising:
a current detection sensor, the current detection sensor being installed, for a first coil of at least one phase of a Δ connection type rotating machine in which current flows in the reverse direction at a winding start of the first coil and a winding end of the first coil, such that the current detection sensor surrounds a current path flowing into a leader line at the winding start of the first coil and a current path flowing out from a leader line at the winding end of the first coil; and
a terminal block that accommodates terminals which connect to the winding start and the winding end of the first coil, and is disposed outside the rotating machine, and the current detection sensor is disposed in the terminal block.

21. The insulation diagnostic system according to claim 20,
wherein the first coil and the second coil are provided in a rotator or a stator of the Δ connection type rotating machine.

\* \* \* \* \*